United States Patent [19]

Hirai

[11] Patent Number: 5,861,765

[45] Date of Patent: Jan. 19, 1999

[54] ANALOGUE DELAY CIRCUIT WITH A CONSTANT DELAY TIME

[75] Inventor: Masahiko Hirai, Tokyo, Japan

[73] Assignee: NEC Corporation, Tokyo, Japan

[21] Appl. No.: 720,690

[22] Filed: Oct. 2, 1996

[30] Foreign Application Priority Data

Oct. 11, 1995 [JP] Japan ................................. 7-263011

[51] Int. Cl.⁶ ................................................ H03H 11/26
[52] U.S. Cl. ........................................ 327/261; 327/309
[58] Field of Search ................................. 327/261, 276, 327/277, 278, 281, 284, 285, 287, 306, 309, 310, 318, 319–322, 324, 327–328, 333, 375, 436, 437

[56] References Cited

U.S. PATENT DOCUMENTS

| 4,792,705 | 12/1988 | Ouyang et al. | 327/436 |
| 4,886,986 | 12/1989 | Watanabe | 327/321 |
| 4,967,099 | 10/1990 | Mori | 327/309 |
| 5,250,854 | 10/1993 | Lien | 327/328 |
| 5,268,600 | 12/1993 | Yeu | 327/309 |

FOREIGN PATENT DOCUMENTS 402041024  2/1990  Japan ................................. 327/309

*Primary Examiner*—Timothy P. Callahan
*Assistant Examiner*—My-Trang Nu Ton
*Attorney, Agent, or Firm*—Whitham, Curtis & Whitham

[57] ABSTRACT

In an analogue delay circuit which is constructed from a p-type MOS transistor and an n-type MOS transistor and which includes an inverter gate for inputting input signals and a capacitance having one electrode connected to ground and the other electrode connected to the drain of the inverter gate, the gate potential of the n-type MOS transistor is limited by means of a clamping circuit so as not to exceed the minimum operating voltage, and the potential of a line connected to an electrode of the capacitance is limited by another clamping circuit so as to not exceed the minimum operating voltage.

6 Claims, 5 Drawing Sheets

ANALOGUE DELAY CIRCUIT WITH A CONSTANT DELAY TIME

BACKGROUND OF THE INVENTION

1. Field of the Invention

The present invention relates to an analogue delay circuit.

2. Description of the Related Art

Delay circuits employing the charge and discharge time of capacitance and not requiring synchronizing signals (an analogue delay circuit) are widely used to obtain delay signals of arbitrary signals in a digital circuit.

The basic configuration of a prior-art analogue delay circuit takes the form shown in FIG. 1. Here, an input signal 301 is inputted to an inverter gate 304 made up of a p-type MOS transistor 302 and an n-type MOS transistor 303, the output of inverter gate 304 being connected to line 306. Line 306 is connected to the input of inverter gate 307 and to capacitance 305, the other electrode of which is grounded, and output signal 308, which is the desired delay signal, is obtained from the output of inverter gate 307.

To present the principles of the analogue delay circuit of FIG. 1 in more detail, when, for example, input signal 301 is of a low level (hereinafter abbreviated "L"), p-type MOS transistor 302 making up inverter 304 enters an ON state and n-type MOS transistor 303 enters an OFF state, thereby making line 306 a high level (hereinafter abbreviated "H") and output signal 308 "L." Charge is hereupon accumulated in line 306 and each electrode connected to this line, the electric potential generally being the power source potential $V_{DD}$.

When input signal 301 changes to "H," p-type MOS transistor 302 enters an OFF state and n-type MOS transistor 303 enters an ON state. The charge of line 306 and each electrode connected to this line is released through n-type MOS transistor 303, the potential of line 306 drops to about the ground potential GND, and output signal 308 changes to "H." Because the time required to release the charge of line 306 corresponds to the product RC of the ON resistance R of n-type MOS transistor 303 and the capacitance C of capacitance 305, a delay time can be generated. As a result, when input signal 301 changes from "L" to "H," output signal 308 changes from "L" to "H" after the delay time.

Here, the ON resistance value R of n-type MOS transistor 303 changes according to the voltage inputted to the gate, the ON resistance value R becoming large when the voltage inputted to the gate is low. In other words, the delay time obtained by this analogue delay circuit varies with the change in the power-source voltage $V_{DD}$.

As one means of solving this problem, an analogue delay circuit such as shown in FIG. 2 has been proposed. Analogue delay circuit 401 and 402 are analogue delay circuits such as explained in FIG. 1 but the operating power-source voltage for obtaining the desired delay time differs.

Variations in delay time due to changes in the power-source voltage can be suppressed by adding switches 404 and 405 for selecting the output of one analogue delay circuit according to the power-source voltage and a switch control circuit 403 for controlling these switches.

In order to prevent variations in delay time caused by changes in the power-source voltage, delay circuits according to the above-described prior art necessitate a plurality of analogue delay circuits as well as circuits for switching these circuits according to power-source voltage, and such circuits therefore entail the drawback of enlarged circuit scale. In particular, circuits having a wide range of operating power-source voltages have been impractical due to the necessity for numerous delay circuits.

SUMMARY OF THE INVENTION

The object of the present invention is to provide an analogue delay circuit in which delay time is substantially independent of power-source voltage.

To achieve the above-described object, the analogue delay circuit of the present invention includes an inverter gate that is constructed from a p-type MOS transistor and an n-type MOS transistor and that inputs input signals, a capacitance having one electrode connected to ground and the other electrode connected to the drains of the n-type and p-type MOS transistors, first clamping means that limits the electrode potential of the capacitance to below a fixed potential, and second clamping means that limits the gate potential of the n-type MOS transistor to below a fixed potential.

To achieve the above-described object, another analogue delay circuit of the present invention includes an inverter gate that is constructed from a p-type MOS transistor and an n-type MOS transistor and that inputs input signals, a capacitance having one electrode connected to a power source first clamping means connected to a second electrode of the capacitance that limits the electrode to above a fixed potential, and second clamping means that limits the gate potential of the p-type MOS transistor to above a fixed potential.

Due to the control by the clamping means that prevents the gate potential of the n-type MOS transistor and the potential of a line connected to the capacitance electrode from rising above a fixed potential (from falling below a fixed potential), the charge that is charged to the capacitance is at a constant fixed amount, and the ON resistance of the n-type MOS transistor is also a constant fixed resistance value. In other words, the discharge time is not affected by changes in the power-source voltage $V_{DD}$, and therefore, a fixed delay time can be obtained.

Furthermore, because a fixed delay time can be obtained over a wide range of power-source voltages, the present invention enables a circuit of far smaller scale than a method in which a plurality of delay circuits are provided.

According to an embodiment of the present invention, the first and second clamping means are constructed from two or more n-type MOS transistors all of which are in an ON state and connected to each other in a series between ground and a line joining input and output.

An analogue delay circuit according to the present invention includes:

a first p-type MOS transistor and a first n-type MOS transistor connected in series to each other between a power source and a ground;

a first inverter gate for inverting an input signal of said delay circuit;

a second inverter gate for inverting said input signal and outputting the inverted input signal to the gate of said first n-type MOS transistor;

capacitance means having a first electrode and a second electrode, the second electrode being connected to power source;

first clamping means having an input connected to the drain of said first p-type of MOS transistor and to the drain of the first n-type MOS transistor, and having an output connected to the second electrode of said capacitance means, for limiting a potential of said capacitance means to below a fixed potential;

second clamping means for receiving an inverted input signal from said first inverter gate, and having an output connected to the gate of said first p-type MOS transistor, for limiting a gate potential of said p-type MOS transistor to above a fixed potential;

third inverter gate consisting of a second p-type MOS transistor and a resistance connected in series to each other between a power source and a ground, the gate of said second p-type MOS transistor being connected to the second electrode of said capacitance means, the connection between said second n-type MOS transistor and said resistance being an output of said third inverter gate; and fourth inverter gate for inverting a signal on the output of said third inverter gate.

Another analogue delay circuit according to the present invention includes:

a first p-type MOS transistor and a first n-type MOS transistor connected in series to each other between a power source and a ground;

a first inverter gate for inverting an input signal of said delay circuit and outputting the inverted input signal to the gate of said first p-type MOS transistor;

a second inverter gate for inverting said input signal;

capacitance means having a first electrode and a second electrode, said first electrode being connected to said ground;

first clamping means having an input connected to the drain of said first p-type MOS transistor and the drain of said first n-type MOS transistor, and having an output connected to the second electrode of said capacitance means, for limiting a potential of said other electrode to below a fixed potential;

second clamping means having an input receiving the inverted input signal of said second inverter gate and an output connected to the gate of said first n-type MOS transistor, and for limiting gate potential of said first n-type MOS transistor to below a fixed potential;

a third inverter gate having an ON-state depression n-type MOS transistor and a second n-type MOS transistor connected in series to each other between a power source and a ground, the gate of said second n-type MOS transistor being connected to the second electrode of said capacitance means, the drains of said ON-state depression n-type MOS and second n-type MOS transistor being an output of said third inventor gate;

a fourth inverter gate for inverting a signal on the output of said third inverter gate.

The above and other objects, features, and advantages of the present invention will become apparent from the following description based on the accompanying drawings which illustrate examples of the present invention.

DETAILED DESCRIPTION OF THE PREFERRED EMBODIMENTS

Figure 1:
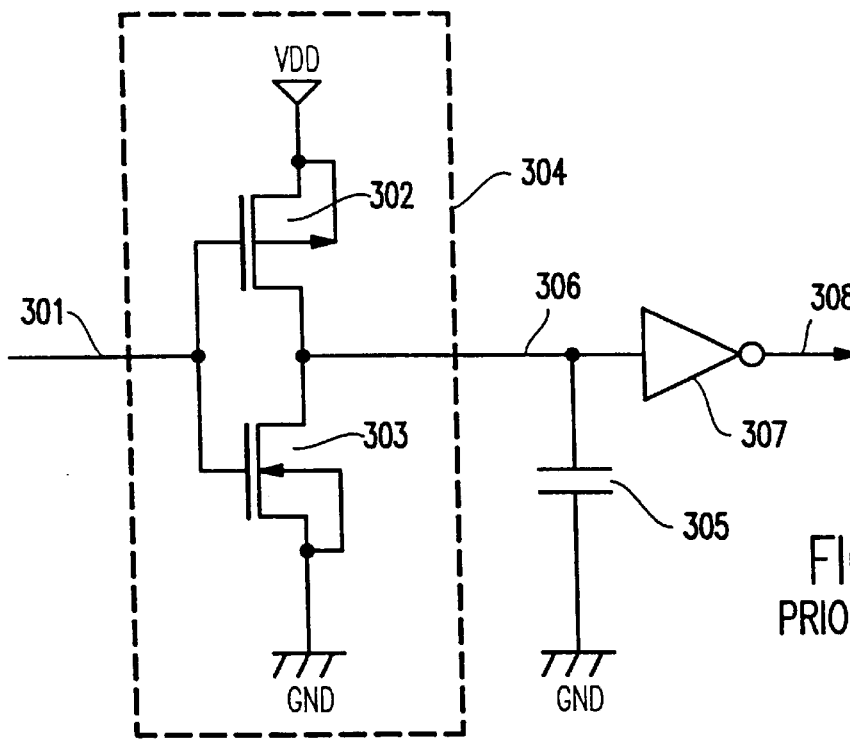
FIG. 1 is a circuit diagram showing a basic analogue delay circuit of the prior art.
Figure 2:
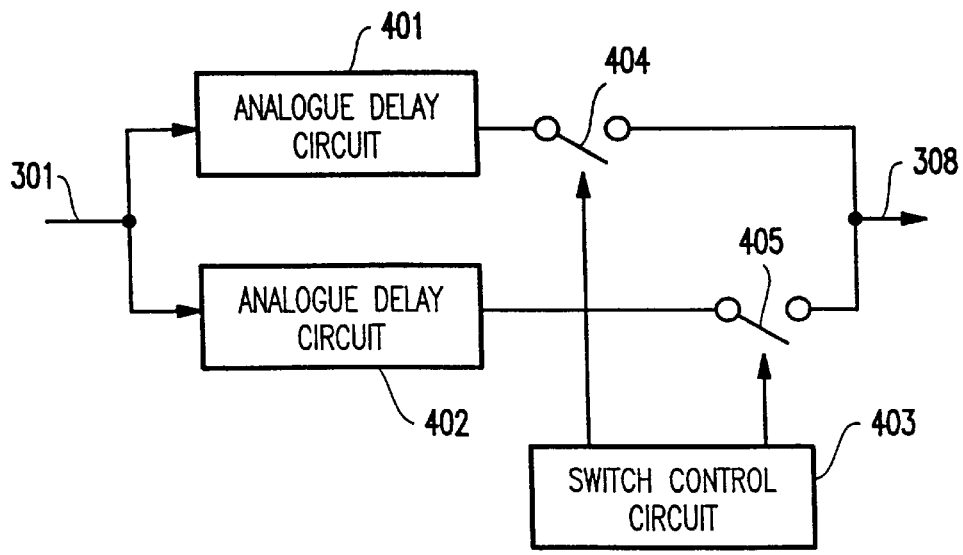
FIG. 2 is a circuit diagram showing an analogue delay circuit that has already been proposed as a solution to the problems of the analogue delay circuit of FIG. 1.
Figure 3:
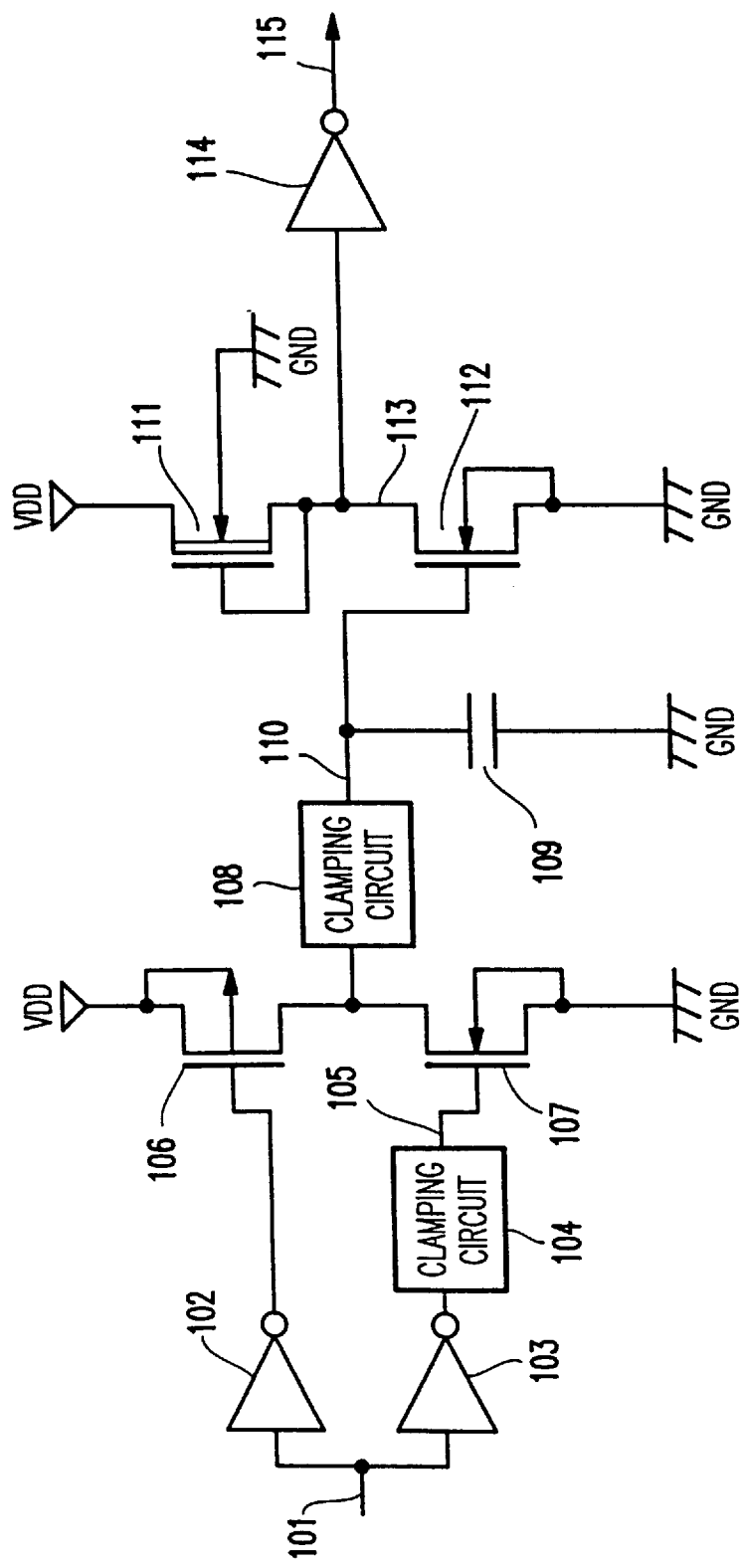
FIG. 3 is a circuit diagram showing an analogue delay circuit according to the first embodiment of the present invention.

The first embodiment of the present invention will next be explained with reference to the accompanying FIGS. 3 to 5. Input signals 101 inputted to the analogue delay circuit of FIG. 3 are inputted to inverter gates 102 and 103, and moreover, respectively inputted to p-type MOS transistor 106 and, by way of clamping circuit 104, to n-type MOS transistor 107.

Figure 4:
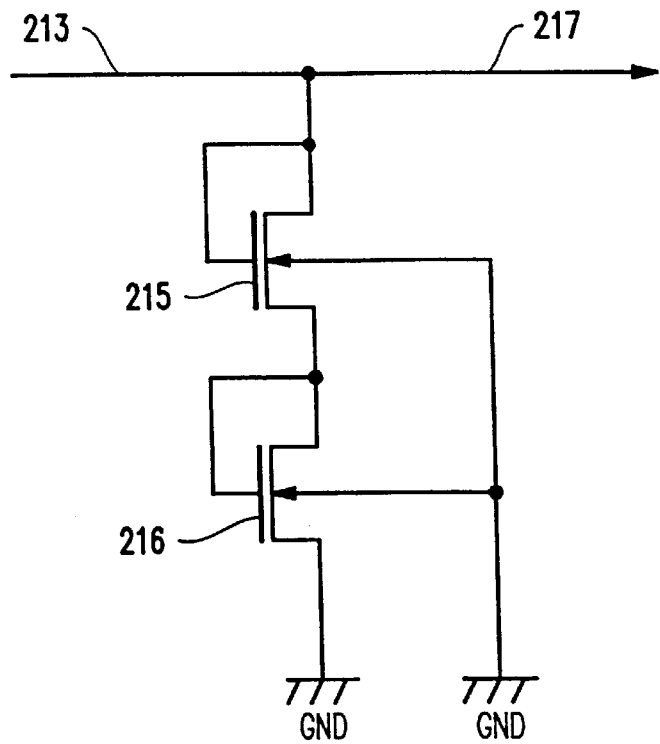
FIG. 4 is a circuit diagram showing clamping circuits 104 and 108 of FIG. 3.

Here, clamping circuit 104 and clamping circuit 108 (to be described) are constructed, for example, as shown in FIG. 4, and act to prevent voltage from rising above a fixed voltage when at a high level. In the construction shown in FIG. 4, the line joining input 213 and output 217 is limited to a voltage level corresponding to the sum of the threshold voltages of two n-type MOS transistors 215 and 216.

The outputs of p-type MOS transistor 106 and n-type MOS transistor 107 are connected by way of clamping circuit 108 and line 110 to one electrode of capacitance 109, which has its other end connected to ground potential, and to the gate of n-type MOS transistor 112.

An NMOS inverter gate is constructed from n-type MOS transistor (depression) 111 in ON state and n-type MOS transistor 112, and the output of this NMOS inverter gate is inputted to inverter gate 114. The output of inverter gate 114 becomes the output signal 115 of the analogue delay circuit.

The operation of the analogue delay circuit of this embodiment will next be explained with reference to the timing chart of FIG. 5.

Figure 5:
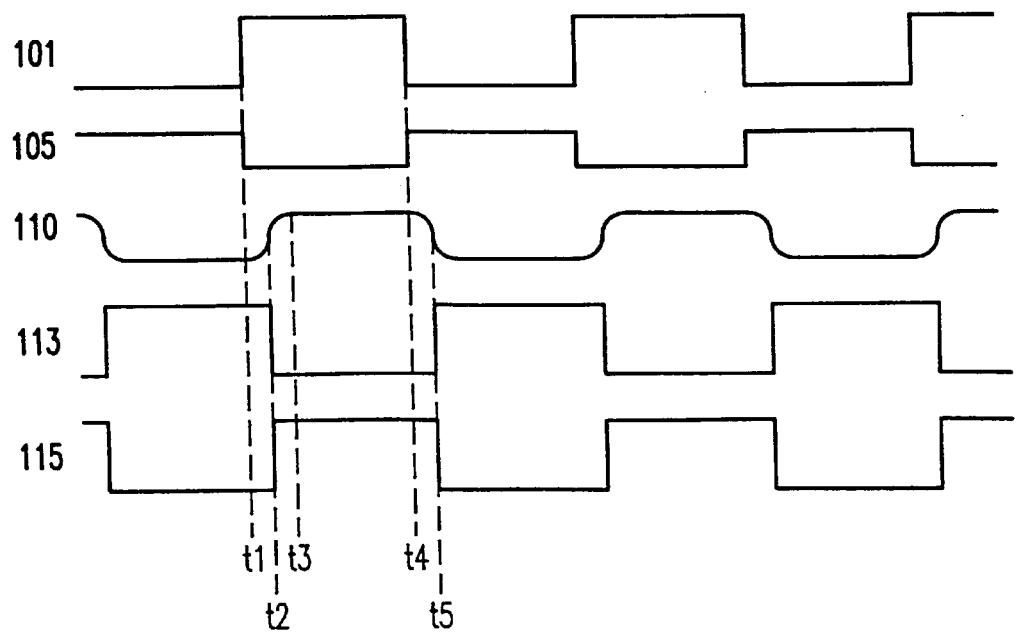
FIG. 5 is a timing chart illustrating the operation of the analogue delay circuit of FIG. 3.

In the explanation of the timing chart of FIG. 5, "H" is a high level of potential substantially equal to the power-source potential, "H'" is a high level of potential lower than the power-source potential, and "L" is a low level of potential substantially equal to the ground potential. Signals 101, 113, and 115 oscillate between "H" and "L," and 105 and 110 oscillate between "H'" and "L."

When input signal 101 changes from "L" to "H" at time t1, the gate potential of p-type MOS transistor 106 changes from "H" to "L," whereby p-type MOS transistor 106 enters an ON state, and charging of capacitance 109 begins by way of clamping circuit 108. The potential of line 110 consequently rises gradually, and n-type MOS transistor 112 enters an ON state at time t2, whereby the output 115 of analogue delay circuit changes from "L" to "H."

At time t3, the potential of line 110 is limited by clamping circuit 108 to the "H'" level, which is a lower potential than the power-source potential.

At time t4, input signal 101 changes from "H" to "L," whereupon the gate potential of p-type MOS transistor 106 changes from "L" to "H", and p-type MOS transistor 106 enters an OFF state. The gate potential 105 of n-type MOS transistor 107 changes from "L" to the "H'" level that is limited by clamping circuit 105, and n-type MOS transistor 107 enters an ON state. Capacitance 109 is in a charge-accumulating state at time t3, and this charge is consequently discharged through n-type MOS transistor 107.

The potential of line 110 gradually falls, and at time t5, n-type MOS transistor 112 is placed in an OFF state and output signal 115 of analogue delay circuit thereby changes from "H" to "L."

The difference between times t4 and t5 is obtained as the delay time.

In this example, the gate potential of n-type MOS transistor 107 and the potential of line 110, which is connected to an electrode of capacitance 109, are controlled by means of clamping circuits 104 and 108 so as not to exceed the minimum operation voltage, and as a result, the amount of charge charged to capacitance 109 is always uniform and the ON resistance value of n-type MOS transistor 107 is always at a fixed resistance. In other words, the discharge time is unaffected by changes in power-source voltage $V_{DD}$, and therefore, a uniform delay time can be obtained.

Explanation will next be given regarding the second embodiment of the present invention with reference to the accompanying FIGS. 6–8. Components equivalent to those in FIG. 3 are labeled with the same reference numerals.

Figure 6:
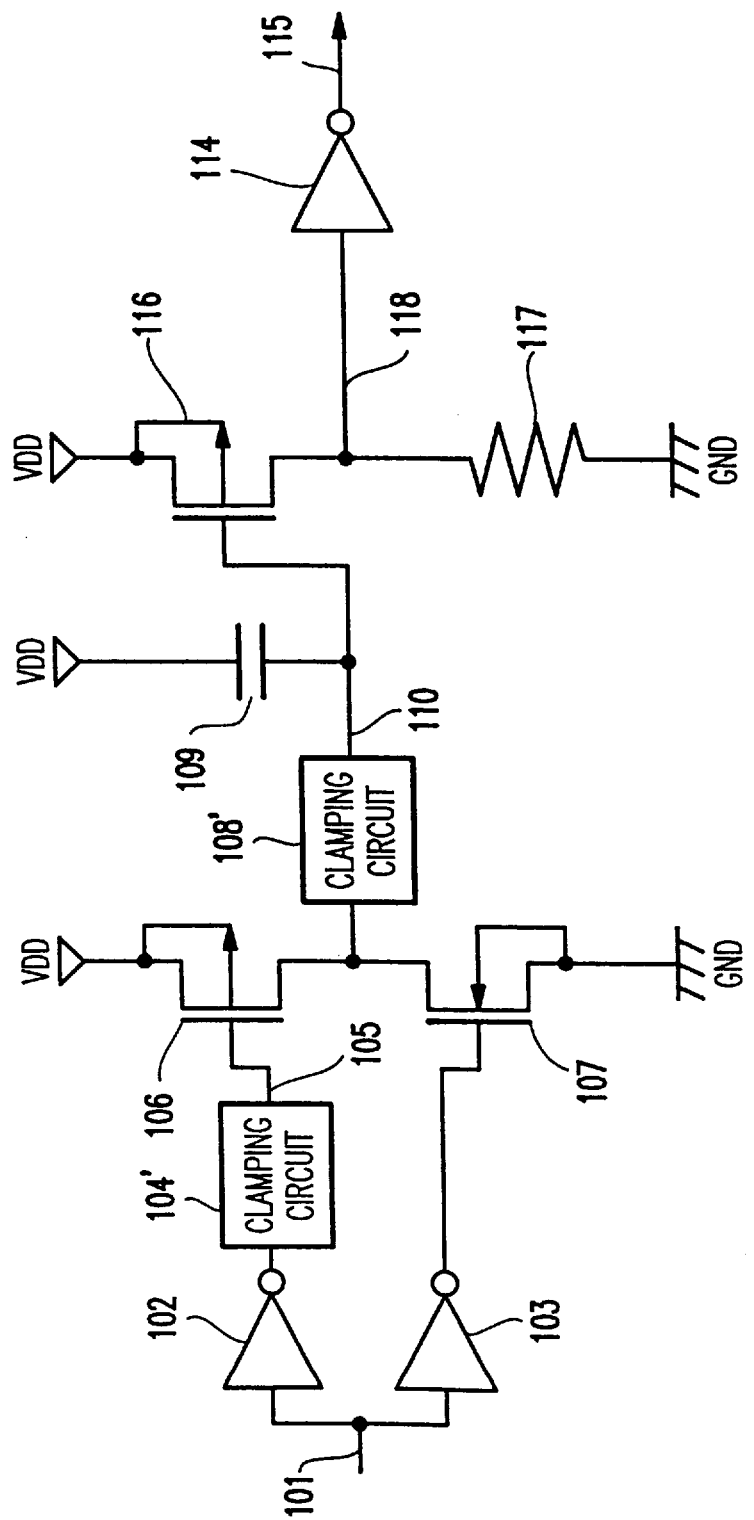
FIG. 6 is a circuit diagram of the analogue delay circuit according to the second embodiment of the present invention.
Figure 7:
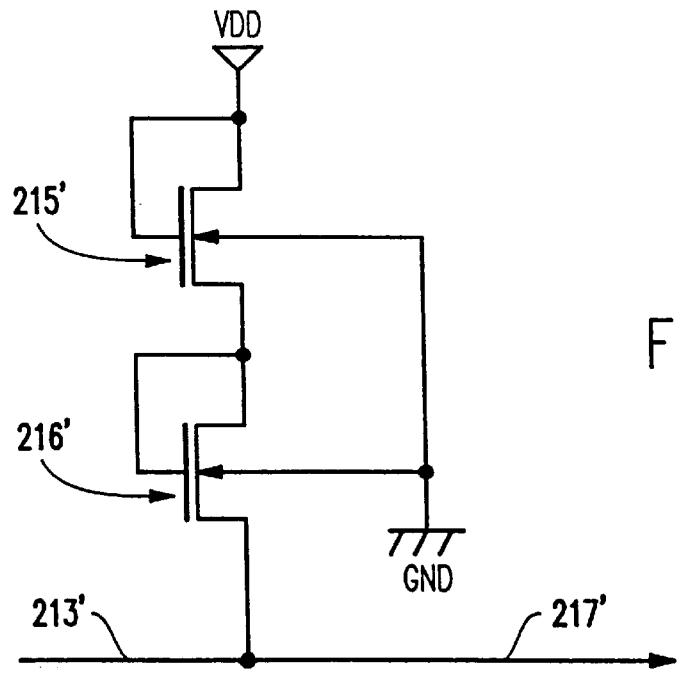
FIG. 7 is a circuit diagram showing clamping circuits 104' and 108' of FIG. 6.

Input signals 101 inputted to the analogue delay circuit of FIG. 6 are inputted to inverters 102 and 103, and these signals are then respectively inputted to n-type MOS transistor 107, and by way of clamping circuit 104', to p-type MOS transistor 106. Here, clamping circuit 104' and clamping circuit 108' (to be explained) serve to prevent voltage from falling below a fixed voltage when at a low level, and are constructed, for example, as shown in FIG. 5. In the construction shown in FIG. 7, the line joining input 213' and output 217' is limited to a potential reduced from the power-source potential by an amount corresponding to the sum of threshold voltages of the two n-type MOS transistors 215' and 216'.

The outputs of p-type MOS transistor 106 and n-type MOS transistor 107 are connected by way of clamping circuit 108' and line 110 to one electrode of capacitance 109, which is connected at its other end to the power-source potential, and to the gate of p-type MOS transistor 116. An inverter gate is constructed from resistance 117 and p-type MOS transistor 116, and the output of this inverter gate is inputted to inverter gate 114. The output of inverter gate 114 becomes the output signal 115 of the analogue delay circuit.

The operation of the analogue delay circuit of FIG. 6 will next be explained with reference to the timing chart of FIG. 8.

Figure 8:
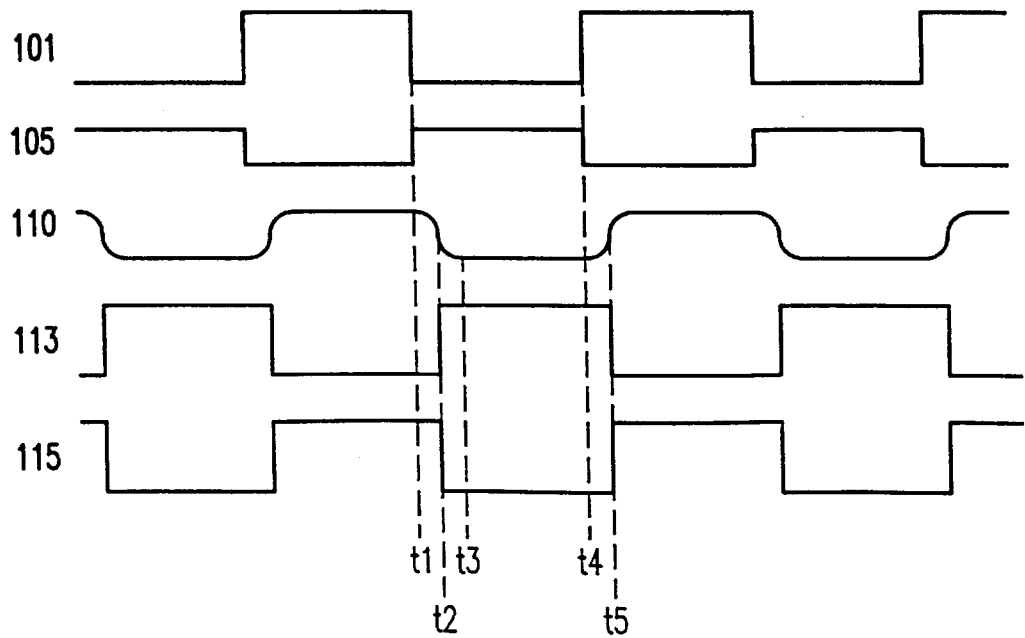
FIG. 8 is a timing chart illustrating the operation of the analogue delay circuit of FIG. 6.

In the explanation of the timing chart of FIG. 8, "H" is a high level of potential substantially equal to the power source potential, "L'" is a low level of potential higher than the ground potential, and "L" is a low level of potential substantially equal to the ground potential. In FIG. 7, 101, 118, and 115 oscillate between "H" and "L," and 105 and 110 oscillate between "H" and "L'."

When input signal 101 changes from "H" to "L" at time t1, the gate potential of n-type MOS transistor 107 changes from "L" to "H," whereby n-type MOS transistor 107 enters an ON state and capacitance 109 begins to discharge. The potential of line 110 thereupon gradually falls, placing p-type MOS transistor 116 in an ON state at time t2. Output signal 115 of the analogue delay circuit therefore changes from "H" to "L." At time t3, the potential of line 110 is limited by clamping circuit 108' to a level "L'" which is a potential higher than the ground potential.

When input signal 101 changes from "L" to "H" at time t4, the gate potential of n-type MOS transistor 107 changes from "H" to "L," and n-type MOS transistor 107 thereby enters an OFF state. The gate potential of p-type MOS transistor 106 changes from "H" to "L'," which is the level limited by clamping circuit 104', and p-type MOS transistor 106 enters an ON state. Capacitance 109 enters a charge-discharging state at time t3, and charge is therefore charged through p-type MOS transistor 106.

The potential of line 110 gradually rises and places p-type MOS transistor 116 in an OFF state at time t5. Output signal 115 of the analogue delay circuit therefore changes from "L" to "H."

The difference between times t4 and t5 is obtained as the delay time.

Here, the gate potential of p-type MOS transistor 106 and the potential of line 110, which is connected to an electrode of capacitance 109, are limited by means of clamping circuits 104' and 108' so as not to fall from the power-source voltage more than a certain fixed value (within a voltage range allowing drops when operating at a minimum operation power-source voltage), and consequently, the charge that is discharged from capacitance 109 is always a fixed amount and the ON resistance of p-type MOS transistor 106 is also always a fixed resistance value. In other words, the discharge time is unaffected by changes in the power-source voltage $V_{DD}$ and a uniform delay time can be obtained.

While preferred embodiments of the present invention have been described using specific terms, such description is for illustrative purposes only, and it is to be understood that changes and variations may be made without departing from the spirit or scope of the following claims.

What is claimed is:

1. An analogue delay circuit comprising:
   a first p-type MOS transistor and a first n-type MOS transistor connected in series to each other between a power source and a ground;
   means for transmitting an input signal of said analog delay circuit to the gate of said first p-type MOS transistor;
   capacitance means having a first and a second electrode, the first connected to said ground;
   first clamping means having an input connected to the drain of said first p-type MOS transistor and the drain of said first n-type MOS transistor, and an output connected to the second electrode of said capacitance means, for limiting a potential of said capacitance means to below a fixed potential;
   second clamping means having an input connected to the input signal of said analog delay circuit and an output connected to the gate of said first n-type MOS transistor, for limiting a gate potential of said first n-type MOS transistor to below a fixed potential.

2. An analogue delay circuit according to claim 1, wherein said first and second clamping means include two or more second n-type MOS transistors connected to each other in series between said ground and a line joining said input and said output of each of said first and second clamping means, and wherein said first and second clamping means are in an ON state when a potential at said means' respective line exceeds the sum of threshold voltages of said means' respective two or more second n-type MOS transistors.

3. An analogue delay circuit comprising:
   a first p-type MOS transistor and a first n-type MOS transistor connected in series to each other between a power source and a ground;
   means for transmitting an input signal of said analog delay circuit to the gate of said first p-type MOS transistor;

capacitance means having a first electrode and a second electrode, the first electrode being connected to ground;

first clamping means having an input connected to the drain of said first p-type MOS transistor and the drain of said first n-type MOS transistor, and an output connected to the second electrode of said capacitance means, for limiting a potential of said capacitance means to below a fixed potential; and second clamping means having an input connected to the input signal of said analog delay circuit and an output connected to the gate of said first p-type MOS transistor, for limiting a gate potential of said first p-type MOS transistor to above a fixed potential.

4. An analogue delay circuit according to claim 3 wherein said first and second clamping means each include two or more second n-type transistors connected to each other in series between ground and a line joining the input and the output of each of said first and second clamping means, and wherein said first and second clamping means are in an ON state when a potential at said means' respective line exceeds the sum of the threshold voltages of said means' respective two or more second n-type MOS transistors.

5. An analogue delay circuit comprising:

a first p-type MOS transistor and a first n-type MOS transistor connected in series to each other between a power source and a ground;

a first inverter gate for inverting an input signal of said delay circuit and outputting the inverted input signal to the gate of said first p-type MOS transistor;

a second inverter gate for inverting said input signal;

capacitance means having a first electrode and a second electrode, said first electrode being connected to said ground;

first clamping means having an input connected to the drain of said first p-type MOS transistor and the drain of said first n-type MOS transistor, and having an output connected to the second electrode of said capacitance means, for limiting a potential of said other electrode to below a fixed potential;

second clamping means having an input receiving the inverted input signal of said second inverter gate and an output connected to the gate of said first n-type MOS transistor, and for limiting gate potential of said first n-type MOS transistor to below a fixed potential;

a third inverter gate having an ON-state depression n-type MOS transistor and a second n-type MOS transistor connected in series to each other between a power source and a ground, the gate of said second n-type MOS transistor being connected to the second electrode of said capacitance means, the drains of said ON-state depression n-type MOS and second n-type MOS transistor being an output of said third inverter gate;

a fourth inverter gate for inverting a signal on the output of said third inverter gate.

6. An analogue delay circuit comprising:

a first p-type MOS transistor and a first n-type MOS transistor connected in series to each other between a power source and a ground;

a first inverter gate for inverting an input signal of said delay circuit;

a second inverter gate for inverting said input signal and outputting the inverted input signal to the gate of said first n-type MOS transistor;

capacitance means having a first electrode and a second electrode, the first electrode being connected to the power source;

first clamping means having an input connected to the drain of said first p-type MOS transistor and to the drain of the first n-type MOS transistor, and having an output connected to the second electrode of said capacitance means, for limiting a potential of said capacitance means to below a fixed potential;

second clamping means for receiving an inverted input signal from said first inverter gate, and having an output connected to the gate of said first p-type MOS transistor, for limiting a gate potential of said p-type MOS transistor to above a fixed potential;

third inverter gate consisting of a second p-type MOS transistor and a resistance connected in series to each other between a power source and a ground, the gate of said second p-type MOS transistor being connected to the second electrode of said capacitance means, the connection between said second n-type MOS transistor and said resistance being an output of said third inverter gate; and fourth inverter gate for inverting a signal on the output of said third inverter gate.

* * * * *